United States Patent
Yosui

(10) Patent No.: US 9,485,860 B2
(45) Date of Patent: Nov. 1, 2016

(54) MULTILAYER BOARD

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/859,625

(22) Filed: Sep. 21, 2015

(65) Prior Publication Data

US 2016/0014893 A1 Jan. 14, 2016

Related U.S. Application Data

(63) Continuation of application No. PCT/JP2014/067327, filed on Jun. 30, 2014.

(30) Foreign Application Priority Data

Jul. 30, 2013 (JP) ................................. 2013-157830

(51) Int. Cl.
*H05K 1/00* (2006.01)
*H05K 1/03* (2006.01)
(Continued)

(52) U.S. Cl.
CPC ............ *H05K 1/0346* (2013.01); *H05K 1/028* (2013.01); *H05K 1/0333* (2013.01);
(Continued)

(58) Field of Classification Search
CPC ............ H05K 1/00; H05K 1/02; H05K 1/03; H05K 1/09; H05K 1/11; H05K 1/14; H05K 1/18; H05K 3/00; H05K 3/10; H05K 3/36; H05K 3/46; H01L 21/02; H01L 21/48; H01L 23/02; H01L 23/48
USPC ........ 174/250, 251, 254–258, 260–262, 264; 439/493; 427/97.1; 430/319; 156/60, 156/247, 256

See application file for complete search history.

(56) References Cited

U.S. PATENT DOCUMENTS 4,687,695 A * 8/1987 Hamby ................ H05K 3/4691
174/254
4,715,928 A * 12/1987 Hamby ................ H05K 3/4691
156/150
(Continued)

FOREIGN PATENT DOCUMENTS

JP 2001-36246 A 2/2001
JP 2004-319962 A 11/2004
(Continued)

OTHER PUBLICATIONS

Official Communication issued in International Patent Application No. PCT/JP2014/067327, mailed on Aug. 12, 2014.
(Continued)

*Primary Examiner* — Xiaoliang Chen
(74) *Attorney, Agent, or Firm* — Keating & Bennett, LLP

(57) ABSTRACT

In a flexible board including laminated resin layers containing the same thermoplastic resin as a principal material, a rigid portion includes a region in which a first resin layer is disposed between a second resin layer defining an upper principal surface and a third resin layer defining a lower principal surface so that the rigid portion has a large thickness, and a flexible portion includes a region in which the first resin layer is not disposed between the second and third resin layers so that the flexible portion has flexibility, a step portion at which a thickness changes is between the rigid and flexible portions, and the second and third resin layers extend in a region from the rigid portion beyond the step portion to the flexible portion.

18 Claims, 7 Drawing Sheets

(51) Int. Cl.
*H05K 3/46* (2006.01)
*H05K 1/02* (2006.01)

(52) U.S. Cl.
CPC ......... *H05K 3/4691* (2013.01); *H05K 3/4632* (2013.01); *H05K 2201/0129* (2013.01); *H05K 2201/0141* (2013.01); *H05K 2201/0154* (2013.01)

(56) References Cited

U.S. PATENT DOCUMENTS

| | | | | | |
|---|---|---|---|---|---|
| 5,121,297 | A | * | 6/1992 | Haas | H05K 3/4691 174/254 |
| 6,492,616 | B1 | * | 12/2002 | Tanaka | H01L 21/486 219/121.71 |
| 8,143,529 | B2 | * | 3/2012 | Harada | H05K 3/4617 174/256 |
| 2002/0140076 | A1 | * | 10/2002 | Yamazaki | H01L 21/4857 257/686 |
| 2003/0173105 | A1 | * | 9/2003 | Kondo | H05K 3/4691 174/255 |
| 2004/0008982 | A1 | * | 1/2004 | Matsuo | G02B 7/28 396/89 |
| 2004/0112632 | A1 | * | 6/2004 | Michiwaki | H05K 3/4691 174/254 |
| 2005/0243528 | A1 | * | 11/2005 | Murayama | H05K 1/148 361/760 |
| 2006/0042826 | A1 | * | 3/2006 | Kondo | H05K 3/4617 174/255 |
| 2006/0101640 | A1 | * | 5/2006 | Lee | H05K 3/4691 29/846 |
| 2006/0180344 | A1 | * | 8/2006 | Ito | H01L 23/5385 174/262 |
| 2007/0013041 | A1 | * | 1/2007 | Ishigaki | H05K 3/4691 257/686 |
| 2007/0281142 | A1 | * | 12/2007 | Ohta | C08F 255/00 428/209 |
| 2007/0281505 | A1 | * | 12/2007 | Kobayashi | H05K 3/4691 439/69 |
| 2008/0171139 | A1 | * | 7/2008 | Ueno | H05K 3/4691 427/97.1 |
| 2008/0202676 | A1 | * | 8/2008 | Ueno | H05K 3/4691 156/247 |
| 2008/0286696 | A1 | * | 11/2008 | Ueno | H05K 3/4691 430/319 |
| 2008/0289859 | A1 | * | 11/2008 | Mikado | H05K 1/0281 174/254 |
| 2009/0028497 | A1 | * | 1/2009 | Kodama | G02B 6/43 385/14 |
| 2009/0084583 | A1 | * | 4/2009 | Ueno | H05K 3/4691 174/254 |
| 2009/0086450 | A1 | * | 4/2009 | Matsui | H05K 3/4691 361/761 |
| 2009/0114428 | A1 | * | 5/2009 | Ueno | H05K 3/28 174/254 |
| 2009/0242241 | A1 | * | 10/2009 | Takahashi | H05K 3/4691 174/254 |
| 2009/0314523 | A1 | * | 12/2009 | Ito | B32B 17/04 174/254 |
| 2010/0051325 | A1 | * | 3/2010 | Sato | H05K 3/4691 174/254 |
| 2010/0139967 | A1 | * | 6/2010 | Takahashi | H05K 1/142 174/262 |
| 2011/0056732 | A1 | * | 3/2011 | Uratsuji | H05K 3/4691 174/254 |
| 2011/0180306 | A1 | * | 7/2011 | Naganuma | H05K 1/115 174/254 |
| 2011/0194262 | A1 | * | 8/2011 | Naganuma | H05K 3/4691 361/749 |
| 2011/0198111 | A1 | * | 8/2011 | Naganuma | H05K 3/4691 174/254 |
| 2011/0203837 | A1 | * | 8/2011 | Naganuma | H05K 3/4691 174/254 |
| 2012/0012368 | A1 | * | 1/2012 | Takahashi | H05K 3/4691 174/254 |
| 2012/0045168 | A1 | * | 2/2012 | Uemura | G02B 6/1221 385/14 |
| 2012/0097326 | A1 | * | 4/2012 | Wang | H05K 3/4691 156/257 |
| 2012/0097433 | A1 | * | 4/2012 | Kato | H01P 3/081 174/254 |
| 2012/0181068 | A1 | * | 7/2012 | Kato | H05K 1/0281 174/254 |
| 2012/0218165 | A1 | * | 8/2012 | Kato | H01P 1/213 343/852 |
| 2012/0228005 | A1 | * | 9/2012 | Chisaka | H05K 3/4691 174/250 |
| 2012/0260501 | A1 | * | 10/2012 | Li | H05K 3/4691 29/846 |
| 2012/0325524 | A1 | * | 12/2012 | Naganuma | H05K 3/4691 174/254 |
| 2013/0153269 | A1 | * | 6/2013 | Takahashi | H05K 3/368 174/254 |
| 2013/0199829 | A1 | * | 8/2013 | Gottwald | G01L 19/0645 174/258 |
| 2013/0256001 | A1 | * | 10/2013 | Sakai | H05K 3/4691 174/251 |
| 2013/0292050 | A1 | * | 11/2013 | Chiou | H05K 3/0064 156/252 |
| 2013/0292164 | A1 | * | 11/2013 | Park | H05K 3/10 174/260 |
| 2014/0034366 | A1 | * | 2/2014 | Otsubo | H05K 3/4691 174/254 |
| 2014/0353014 | A1 | * | 12/2014 | Lai | H05K 3/4691 174/254 |
| 2015/0007934 | A1 | * | 1/2015 | Gotzinger | F03B 3/121 156/247 |

FOREIGN PATENT DOCUMENTS

| | | |
|---|---|---|
| JP | 2005-244024 A | 9/2005 |
| JP | 2005-327972 A | 11/2005 |
| JP | 2006-237112 A | 9/2006 |
| JP | 2009-021425 A | 1/2009 |
| WO | 2012/147484 A | 11/2012 |

OTHER PUBLICATIONS

Official Communication issued in Japanese Patent Application No. 2014-561634, mailed on Jul. 7, 2015.

* cited by examiner

MULTILAYER BOARD

BACKGROUND OF THE INVENTION

1. Field of the Invention

The present invention relates to a multilayer board having a structure in which a plurality of resin base materials made from a thermoplastic resin are laminated.

2. Description of the Related Art

Hitherto, a multilayer board has been known in which in a state where a plurality of resin base materials made from a thermoplastic resin are stacked, the resin base materials are fused thus to be joined together (e.g., see International Publication No. WO 2012/147484).

International Publication No. WO 2012/147484 discloses a multilayer board which includes: a flexible portion having a small thickness and flexibility; and rigid portions having a large number of laminated resin sheets and a large thickness. In the multilayer board, a first resin sheet extends over the entire area of the flexible portion and the rigid portions, and in each rigid portion, second resin sheets which form an outer surface of the multilayer board are laminated such that the first resin sheet is interposed therebetween. Thus, in the flexible portion, only the first resin sheet is disposed, so that the thickness of the flexible portion is small. Meanwhile, in each rigid portion, the second resin sheets are disposed so as to be overlaid on the first resin sheet, so that the thickness of the rigid portion is large.

However, in International Publication No. WO 2012/147484, it is conceivable that in bending (deflecting) the flexible portion, a load is applied to a step portion between each rigid portion having a large thickness and the flexible portion having a small thickness and an end portion of the second resin sheet that is located at the step portion is peeled from the first resin sheet.

SUMMARY OF THE INVENTION

Accordingly, preferred embodiments of the present invention provide a multilayer board which is able to significantly reduce or prevent peeling of a resin base material when a flexible portion is bent.

A multilayer board according to a preferred embodiment of the present invention includes a first resin base material portion, a second resin base material portion, and a third resin base material portion which contain the same thermoplastic resin as a principal material and are laminated. The first resin base material portion defines one principal surface of the multilayer board, the second resin base material portion defines the other principal surface of the multilayer board, the third resin base material portion is provided between the first resin base material portion and the second resin base material portion in a lamination direction of the multilayer board, a step portion at which a thickness of the multilayer board changes is provided between a flexible portion which has flexibility and in which the third resin base material portion is not disposed and a thick portion in which the third resin base material portion is disposed so that the thick portion has a thickness larger than that of the flexible portion, and the first resin base material portion and the second resin base material portion extend in a region from the thick portion beyond the step portion to the flexible portion.

In this configuration, since the first resin base material portion and the second resin base material portion extend in the region from the thick portion beyond the step portion to the flexible portion, joined surfaces between the resin base materials are not exposed at the step portion between the thick portion and the flexible portion, and it is possible to significantly reduce or prevent the occurrence of interlayer peeling of the resin base materials from the step portion. In addition, it is possible to change the number of the laminated resin base materials at each portion of the multilayer board, and it is possible to optionally set the thickness, the rigidity, or the like of the multilayer board. Moreover, since the respective resin base material portions contain the same thermoplastic resin as a principal material, it is possible to integrate the resin base material portions through a simple process using a heating press, and interlayer peeling or wire breaking due to a difference in thermal expansion coefficient is less likely to occur. In addition, designing is easy since the material property is almost uniform.

The first resin base material portion and the second resin base material portion are preferably provided over an entire or substantially an entire area of the flexible portion. Thus, the joined surfaces between the resin base materials are not exposed on the one principal surface and the other principal surface over the entire area of the flexible portion, and it is possible to significantly reduce or prevent the occurrence of interlayer peeling of the resin base materials not only in the step portion but also in the flexible portion which is deformed by bending.

The third resin base material portion preferably includes a plurality of layers which are a plurality of resin base materials. Thus, it is possible to significantly reduce or prevent interlayer peeling in the third resin base material portion including the plurality of layers.

Preferably, the third resin base material portion includes a plurality of layers which are a plurality of resin base materials, and the first resin base material portion and the second resin base material portion cover an entirety of an edge portion of the third resin base material portion. Thus, it is possible to significantly reduce or prevent interlayer peeling in the third resin base material portion not only from the step portion but also from the entirety of the edge portion of the third resin base material portion.

The thick portion may be provided at two locations, and the flexible portion may be provided between the thick portions at the two locations. Preferably, the flexible portion has an elongated cable shape connecting the thick portions provided at both sides thereof, and the first resin base material portion and the second resin base material portion extend in the longitudinal direction of the cable-shaped flexible portion from the thick portion at one side to the thick portion at the other side beyond the step portion at the one side, the flexible portion, and the step portion at the other side. Thus, even when the thick portions are provided at both sides in the longitudinal direction of the flexible portion, it is possible to significantly reduce or prevent interlayer peeling from the flexible portion and the step portions at both sides.

According to various preferred embodiments of the present invention, it is possible to significantly reduce or prevent peeling of the resin base materials when the flexible portion is bent. In addition, while peeling of the resin base materials is significantly reduced or prevented, the number of the laminated resin base materials is made partially different to make the thickness partially different, and thus flexibility in designing increases.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a flexible board 10 according to a first preferred embodiment of the present invention will be described.

Figure 1A:
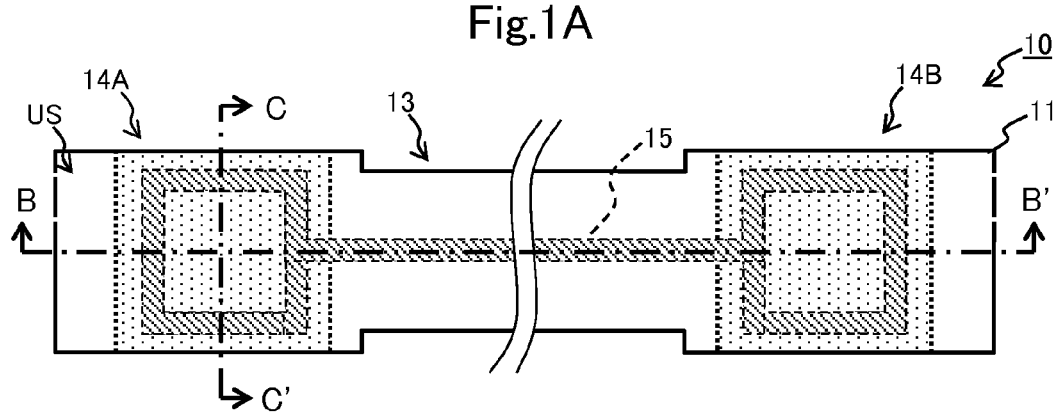
FIG. 1A is a plan view of a flexible board according to a first preferred embodiment of the present invention.
Figure 1B:
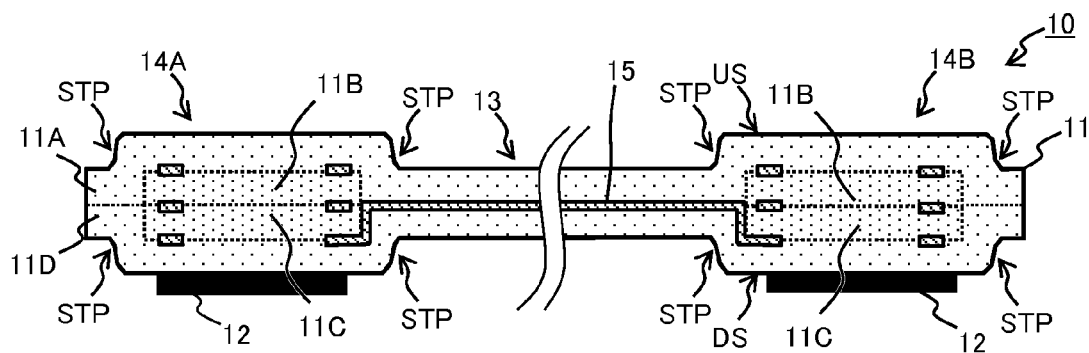
FIGS. 1B and 1C are side cross-sectional views of a flexible board according to a first preferred embodiment of the present invention.
Figure 1C:
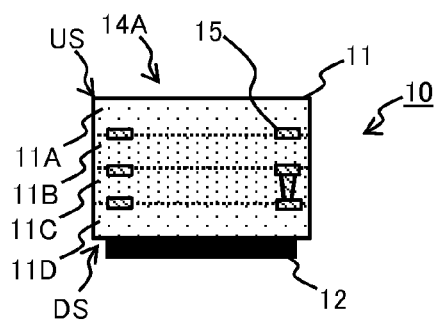

FIG. 1A is a plan view of the flexible board 10. FIG. 1B is a side cross-sectional view of the flexible board 10 at a position shown by B-B' in FIG. 1A. FIG. 1C is a side cross-sectional view of the flexible board 10 at a position shown by C-C' in FIG. 1A. The flexible board 10 is an example of a "multilayer board".

The flexible board 10 includes an upper principal surface US and a lower principal surface LS. The flexible board 10 includes a resin multilayer body 11 and terminal portions 12. Here, the resin multilayer body 11 includes rigid portions 14A and 14B and a flexible portion 13 preferably with an elongated cable shape. The rigid portions 14A and 14B preferably are rectangular or substantially rectangular in a plan view. The flexible portion 13 preferably has a band shape extending in a lengthwise direction (longitudinal direction) which is a right-left direction of the sheet of FIG. 1A, in a plan view, with an up-down direction of the sheet as a widthwise direction (lateral direction). Hereinafter, a direction that coincides with the lengthwise direction of the flexible portion 13 is referred to as "lengthwise direction", and a direction that coincides with the widthwise direction of the flexible portion 13 is referred to as "widthwise direction". The upper principal surface US and the lower principal surface LS are an example of "one principal surface" and "another principal surface", respectively. In addition, the rigid portions 14A and 14B are an example of a "thick portion", and the flexible portion 13 is an example of a "flexible portion".

The rigid portion 14A is connected to a left end, in the lengthwise direction, of the flexible portion 13, and is configured to be wider than the flexible portion 13. The rigid portion 14B is connected to a right end, in the lengthwise direction, of the flexible portion 13, and is configured to be wider than the flexible portion 13. The terminal portions 12 are configured as surface mounted components (connector components), and are surface-mounted on the lower principal surfaces LS of the respective rigid portions 14A and 14B. The rigid portions 14A and 14B each have a thickness larger than that of the flexible portion 13 in a lamination direction of the resin multilayer body 11.

Figure 2:
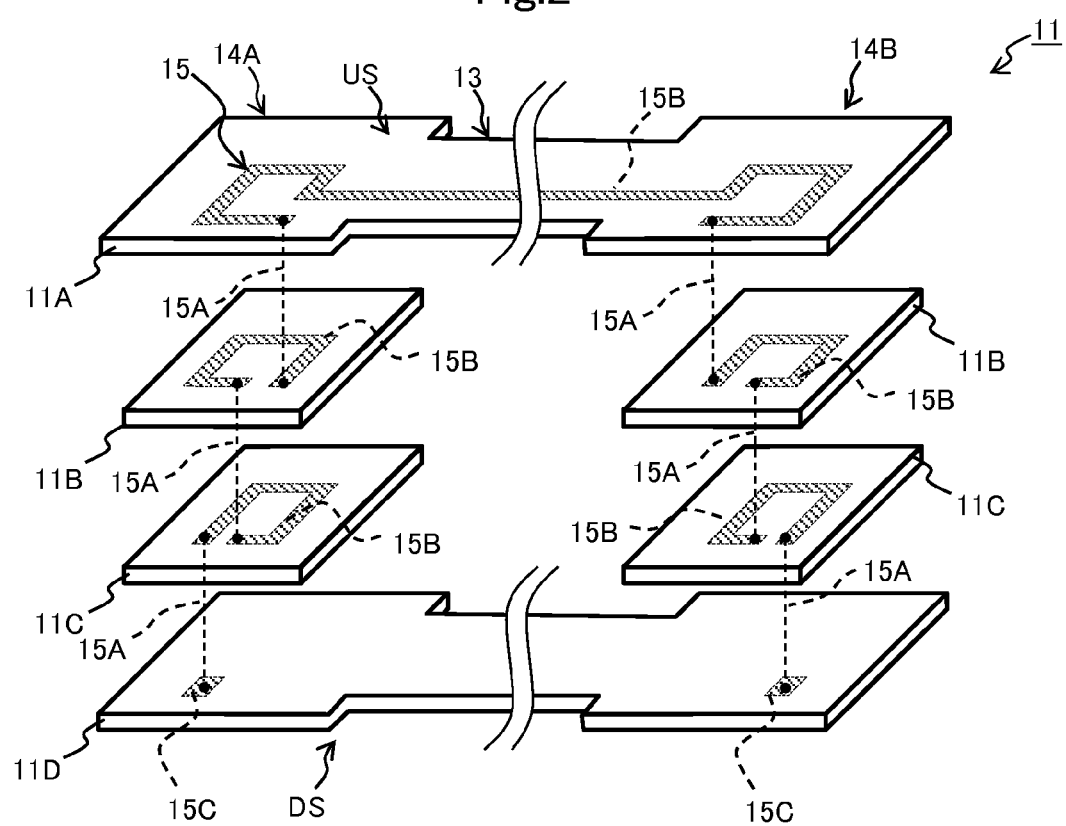
FIG. 2 is an exploded perspective view of the flexible board according to the first preferred embodiment of the present invention.

FIG. 2 is an exploded perspective view of the resin multilayer body 11.

The resin multilayer body 11 includes resin layers (resin base materials) 11A, 11B, 11C, and 11D and a conductor pattern 15. The respective resin layers 11A to 11D are stacked from the upper principal surface US side to the lower principal surface LS side of the resin multilayer body 11 and are joined to each other. The respective resin layers 11A to 11D are preferably made from the same thermoplastic resin, here, configured with a liquid crystal polymer resin as a principal material, for example. It should be noted that another thermoplastic resin such as PEEK (polyether ether ketone), PEI (polyether imide), PPS (polyphenylene sulfide), or PI (polyimide) may be used as the principal material of each of the resin layers 11A to 11D, for example.

The resin multilayer body 11 is configured such that the resin layers 11A to 11D containing the same thermoplastic resin as a principal material are fused to each other to be firmly joined at their joined surfaces to be integrated with each other. In addition, it is possible to prevent occurrence of stress or deformation caused due to a difference in linear expansion coefficient between the laminated layers, and thus it is possible to significantly reduce or prevent the occurrence of peeling between the laminated layers. In addition, it is possible to significantly reduce or prevent the occurrence of a problem such as a break at a connection portion between the flexible portion 13 and each of the rigid portions 14A and 14B.

The conductor pattern 15 is connected to at least the terminal portions 12, and defines an inductor within the resin multilayer body 11. Specifically, the conductor pattern 15 includes interlayer connection conductors 15A, linear conductors 15B, and planar conductors 15C. Each interlayer connection conductor 15A is a conductor extending through any of the resin layers 11A to 11D which define the resin multilayer body 11. Each linear conductor 15B is a conductor extending on the surface of any of the resin layers 11A to 11D which define the resin multilayer body 11. Each planar conductor 15C is a conductor spreading in a planar direction on the surface of any of the resin layers 11A to 11D which define the resin multilayer body 11.

At each of the rigid portion 14A and the rigid portion 14B, the conductor pattern 15 is configured in a coil shape in which the interlayer connection conductors 15A and the linear conductors 15B are connected in a spiral manner with the lamination direction of the resin layers 11A to 11D as a winding axis direction. In addition, at the flexible portion 13, the conductor pattern 15 preferably has a linear shape extending from the one rigid portion 14A to the other rigid portion 14B.

In such a flexible board 10, as shown in FIGS. 1A to 1C, the resin layer 11B and the resin layer 11C which define the resin multilayer body 11 are joined in a state where the resin layer 11B and the resin layer 11C are stacked between the resin layer 11A and the resin layer 11D. Here, an example is shown in which the resin layer 11A as a single layer defines a "first resin base material portion", and an example is shown in which the resin layer 11D as a single layer defines a "second resin base material portion". In addition, an example is shown in which two layers which are the resin layers 11B and 11C define a "third resin base material portion".

The resin layer 11A has an outer shape which coincides with the outer shape of the resin multilayer body 11 in a plan view, and is exposed on the entirety of the upper principal surface US of the resin multilayer body 11. That is, the resin layer 11A defines the entirety of the upper principal surface US of the resin multilayer body 11. The resin layer 11D has an outer shape which coincides with the outer shape of the resin multilayer body 11 in a plan view, and is exposed on the entirety of the lower principal surface LS of the resin multilayer body 11. That is, the resin layer 11D defines the entirety of the lower principal surface LS of the resin multilayer body 11. In other words, the resin layers 11A and 11D are provided over the entire area of the rigid portions 14A and 14B and the flexible portion 13. In addition, the resin layer 11B and the resin layer 11C has the same outer shape partially overlapping the resin layer 11A and the resin layer 11D in a plan view.

Specifically, the resin layer 11B and the resin layer 11C preferably have a rectangular or substantially rectangular shape in a plan view. The dimensions, in the lengthwise direction, of the resin layer 11B and the resin layer 11C are shorter than those of the rigid portions 14A and 14B, and both side surfaces, in the lengthwise direction, of the resin layer 11B and the resin layer 11C are located away from both side surfaces of the rigid portions 14A and 14B (inward of both side surfaces of the rigid portions 14A and 14B). In addition, the dimensions, in the widthwise direction, of the resin layer 11B and the resin layer 11C are equal to those of the rigid portions 14A and 14B, and both side surfaces, in the widthwise direction, of the resin layer 11B and the resin layer 11C are located so as to overlap (be flush with) the side surfaces of the rigid portions 14A and 14B.

Therefore, at each of the rigid portions 14A and 14B, the resin layers 11A and 11D overlap the resin layers 11B and 11C as seen in the lamination direction, and the number of the resin layers preferably is four, for example. In addition, at both end portions, in the lengthwise direction, of each of the rigid portions 14A and 14B, the resin layers 11B and 11C do not overlap and only the resin layers 11A and 11D overlap as seen in the lamination direction, and the number of the resin layers preferably is two, for example. Moreover, in the entire surface of the flexible portion 13, the resin layers 11B and 11C do not overlap and only the resin layers 11A and 11D overlap as seen in the lamination direction, and the number of the resin layers preferably is two, for example. Furthermore, a step portion STP at which the thickness of the resin multilayer body 11 changes is provided between the flexible portion 13 and each of the rigid portions 14A and 14B which are located at both sides, in the longitudinal direction, of the flexible portion 13. The resin layers 11A and 11D extend in a region from the rigid portion 14A at one side beyond the step portion STP to the flexible portion 13. In addition, the resin layers 11A and 11D at the other side also extend in a region from the rigid portion 14B beyond the step portion STP to the flexible portion 13. Specifically, the resin layers 11A and 11D extend continuously from the rigid portion 14A at the one side beyond the step portion STP at the one side, the flexible portion 13, and the step portion STP at the other side to the rigid portion 14B at the other side in the longitudinal direction of the flexible portion 13.

As described above, the number of the resin layers at each of the rigid portions 14A and 14B preferably is greater than the number of the resin layers at the flexible portion 13, and the rigid portions 14A and 14B have a larger thickness and higher rigidity than the flexible portion 13. Therefore, the flexible board 10 is able to improve connection reliability of the surface-mounted terminal portions 12 and mechanically protect the surface-mounted terminal portions 12 while utilizing flexibility at the flexible portion 13.

Although the number of the resin layers is partially different and thus the thickness is partially different at each of the rigid portions 14A and 14B so that the step portion STP is provided, here, the resin layer 11A is exposed on the entirety of the upper principal surface US of the resin multilayer body 11, and the resin layer 11D is exposed on the entirety of the lower principal surface LS of the resin multilayer body 11. That is, the resin layer 11A and the resin layer 11D extend from portions where the resin layers 11B and 11C are disposed, beyond the boundaries between the portions where the resin layers 11B and 11C are disposed and a portion where the resin layers 11B and 11C are not disposed, to the portion where the resin layers 11B and 11C are not disposed. In other words, the resin layer 11A and the resin layer 11D extend continuously in regions from the portions where the resin layers 11B and 11C are disposed, beyond edge portions of the resin layers 11B and 11C to the portion where the resin layers 11B and 11C are not disposed. Thus, even though the step portions STP at which the number of the resin layers changes are present on the upper principal surface US and the lower principal surface LS of the resin multilayer body 11, interlayer peeling of the resin layers 11A to 11D does not progresses from the step portions STP, and a structure having high durability against deformation at the flexible portion 13 is provided.

Both side surfaces, in the lengthwise direction, of each of the resin layers 11B and 11C are covered with the resin layers 11A and 11D and are not exposed on both side surfaces, in the lengthwise direction, of each of the rigid portions 14A and 14B. Meanwhile, both side surfaces, in the widthwise direction, of each of the resin layers 11B and 11C are exposed on both side surfaces, in the widthwise direction, of each of the rigid portions 14A and 14B. However, in the flexible board 10, the flexible portion 13 having the lengthwise direction is mainly deformed, thus great stress does not occur at both side surfaces, in the widthwise direction, of each of the rigid portions 14A and 14B, and there is a low possibility that interlayer peeling occurs, even though the side surfaces of the resin layers 11B and 11C are exposed.

For that reason, here, the resin layers 11B and 11C are configured to be exposed at both side surfaces, in the widthwise direction, of each of the rigid portions 14A and 14B, and thus it is possible to reduce the size of the resin multilayer body 11 in the widthwise direction and efficiently form the resin multilayer body 11 in a simple manufacturing process.

Here, a non-limiting example of a method of manufacturing the flexible board 10 according to the first preferred embodiment will be described.

FIGS. 3A to 3D are side cross-sectional views showing a manufacturing process of the flexible board 10.

FIGS. 3A to 3D each show only a main portion of a single flexible board, but in the present preferred embodiment, a plurality of flexible boards 10 are manufactured at one time from a broad board from which a plurality of flexible boards 10 can be cut out.

Figure 3A:
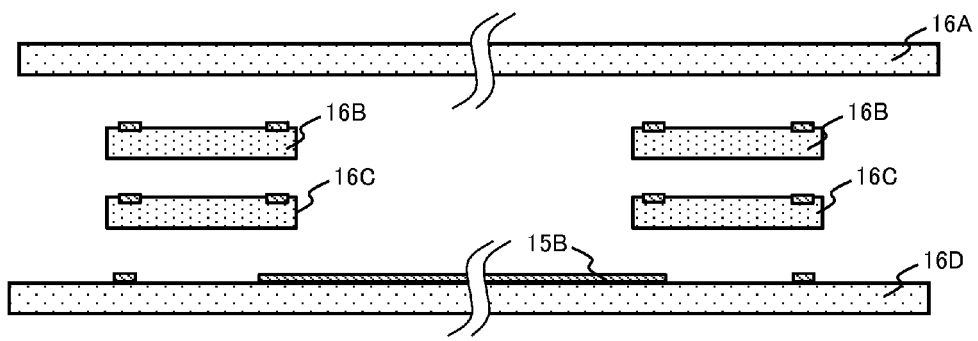
FIGS. 3A to 3D are side cross-sectional views at respective stages of a method of manufacturing the flexible board according to the first preferred embodiment of the present invention.

In the method of manufacturing the flexible board 10, first, resin sheets 16A, 16B, 16C, and 16D shown in FIG. 3A are prepared. The resin sheet 16A is a sheet from which the resin layer 11A of the resin multilayer body 11 is cut out. The resin sheet 16B is a sheet from which the resin layer 11B of the resin multilayer body 11 is cut out. The resin sheet 16C is a sheet from which the resin layer 11C of the resin multilayer body 11 is cut out. The resin sheet 16D is a sheet from which the resin layer 11D of the resin multilayer body 11 is cut out.

The respective resin sheets 16A to 16D contain the same thermoplastic resin as a principal material, and are each provided with a conductive paste in an uncured state and via holes which are to be the interlayer connection conductors 15A (the reference character is not shown in FIGS. 3A to 3D), and the linear conductors 15B and the planar conductors 15C (the reference characters are not shown in FIGS. 3A to 3D) are pattern-formed thereon.

The linear conductors 15B and the planar conductors 15C are preferably formed, for example, by performing pattering of conductor foil by a method such as a photolithographic method on the resin sheets 16A to 16D having the conductor foil previously attached on the entirety of one surface thereof. Alternatively, the linear conductors 15B and the planar conductors 15C are preferably formed by printing a conductive paste on the resin sheets 16A to 16D. Via holes in which a conductive paste which is to be the interlayer connection conductors 15A is to be provided are preferably formed in the resin sheets 16A to 16D by carbon dioxide laser or the like so as to extend through only the thermoplastic resin without extending through the conductor foil on the resin sheets 16A to 16D. The conductive paste within the via holes preferably is composed of a metallic material, an organic solvent, and the like.

Each of the resin sheets 16A to 16D prepared here is a sheet in which a plurality of board regions from each of which the resin multilayer body 11 having a planar shape shown in FIG. 1A is cut out later are arranged lengthwise and breadthwise in the in-plane direction of the sheet for manufacturing a plurality of resin multilayer bodies 11 at one time.

In each of the resin sheets 16A to 16D, in each board region, a shape obtained when each of the resin layers 11A to 11D of the resin multilayer body 11 is seen in a plan view may be partially formed. For example, spaces may be provided at both ends, in the widthwise direction, of the flexible portion 13 shown in FIG. 1A. In addition, spaces may be provided at both sides, in the lengthwise direction, of the resin layers 11B and 11C shown in FIG. 1A. In this case, in the resin sheets 16B and 16C from which a plurality of resin layers 11B and 11C are cut out, preferably, the board regions adjacent to each other in the widthwise direction are previously connected to each other, and each board region is cut out in a subsequent step, thus forming the side surfaces, in the widthwise direction, of the resin layers 11B and 11C.

Figure 3B:
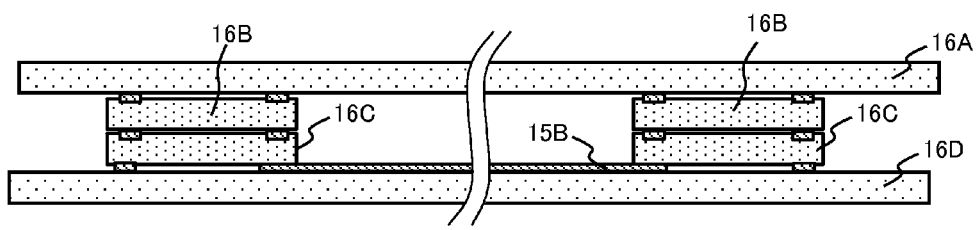

Next, the resin sheets 16A to 16D are appropriately positioned and stacked as shown in FIG. 3B, and are heated and pressed with a heating press.

In stacking the resin sheets 16A to 16D, the resin sheets 16A and 16D and the resin sheets 16B and 16C are stacked such that as seen in the lamination direction, the resin sheets 16B and 16C partially overlap in each board region from which the resin multilayer body 11 is cut out later, and the resin sheets 16A and 16D entirely overlap in each board region. Specifically, the resin sheets 16A and 16D are stacked over a region from portions where the resin sheets 16B and 16C are disposed (portions which are to be the rigid portions 14A and 14B) beyond the edge portions of the resin sheets 16B and 16C to a portion where the resin sheets 16B and 16C are not disposed (a portion which is to be the flexible portion 13). Then, in a state where the resin sheets 16A to 16D are stacked, the resin sheets 16A to 16D are heated and pressed to be joined to each other.

Figure 3C:
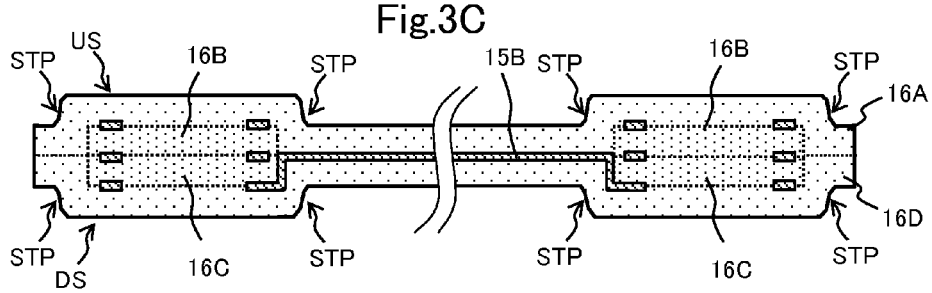

Thus, in pressing the resin sheets 16A to 16D with the heating press, the resin sheets 16A and 16D having flexibility deform along the shapes of the resin sheets 16B and 16C, so that the lower surface of the resin sheet 16A comes into contact with the upper surface and both side surfaces of each resin sheet 16B, and the upper surface of the resin sheet 16D comes into contact with the lower surface and both side surfaces of each resin sheet 16C. Then, by heating with the heating press, the thermoplastic resin which forms the resin sheets 16A to 16D becomes softened and flows, so that gaps between the resin sheets 16A and 16D and the resin sheets 16B and 16C are almost closed. Thus, the resin sheets 16A to 16D are integrated with each other, and the structure shown in FIG. 3C is achieved. It should be noted that after being integrated with each other, the resin sheets 16A, 16B, 16C, and 16D mainly form the resin layers 11A, 11B, 11C, and 11D, respectively.

In heating with the heating press, the conductive paste provided in the via holes in the resin sheets 16A to 16D becomes metallized to form the interlayer connection conductors 15A. By the interlayer connection conductors 15A being formed as described above, the linear conductors 15B or the planar conductors 15C on the adjacent resin sheets with which the conductive paste has been in contact are firmly joined to the interlayer connection conductors 15A. Also because of this, it is possible to enhance the joining strength between the adjacent resin sheets 16A to 16D.

Figure 3D:
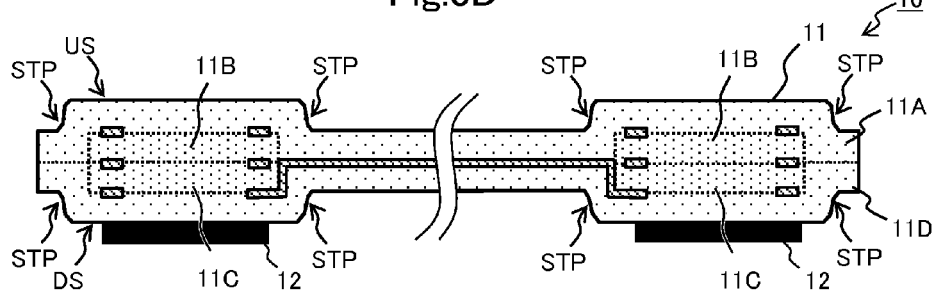

After this step, the resin sheets 16A to 16D that have been joined to each other is taken out from the heating press. After the resin sheets 16A to 16D are sufficiently cured due to fall in temperature, a plurality of resin multilayer bodies 11 are cut out from the respective board regions. Then, after the resin multilayer bodies 11 are cut out from the resin sheets 16A to 16D, the terminal portions 12 are surface-mounted on the lower principal surface LS of the resin layer 11D by using solder or the like. Thus, the structure shown in FIG. 3D is achieved. The step of surface-mounting the terminal portions 12 may be performed before the resin multilayer bodies 11 are cut out from the resin sheets 16A to 16D.

Through each step described above, the flexible board 10 according to the present preferred embodiment is manufactured. In stacking the resin sheets 16A to 16D, the resin sheets 16B and 16C only partially overlap in each board region from which the resin multilayer body 11 is cut out, and the resin sheets 16A and 16D entirely overlap in each board region. Thus, it is possible to provide a portion in which the number of stacked resin sheets is different, in each board region, and it is possible to efficiently manufacture a plurality of flexible boards 10 through a simple manufacturing process by cutting out the resin multilayer body 11 from each board region.

Next, another non-limiting example of a method of manufacturing the flexible board 10 according to the first preferred embodiment of the present invention will be described.

FIGS. 4A to 4E are side cross-sectional views showing a process of manufacturing the flexible board 10.

Figure 4A:
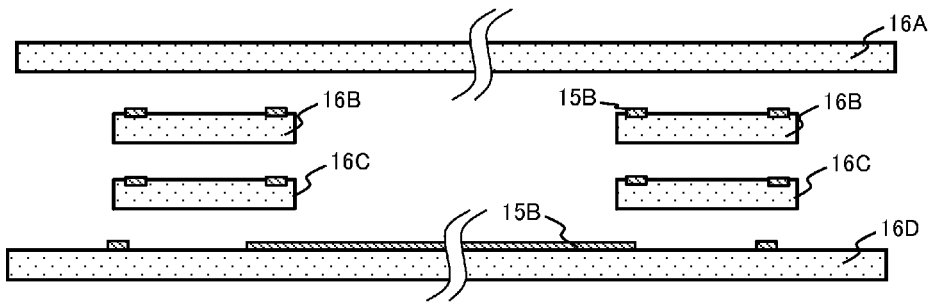
FIGS. 4A to 4E are side cross-sectional views at respective stages of another method of manufacturing the flexible board according to the first preferred embodiment of the present invention.

In this manufacturing method, first, as shown in FIG. 4A, resin sheets 16A to 16D which are to form the resin layers 11A to 11D of the resin multilayer body 11 are prepared.

Figure 4B:
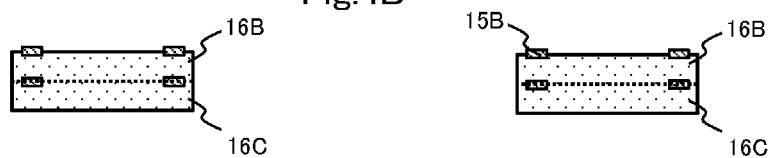

Next, the resin sheets 16B and 16C are appropriately positioned and stacked, and are heated and pressed with a heating press. Thus, the thermoplastic resin of the resin sheets 16B and 16C becomes softened, so that the resin sheet 16B and the resin sheet 16C are fused to each other. Accordingly, the resin sheets 16B and 16C are integrated with each other, and the structure shown in FIG. 4B is achieved.

Figure 4C:
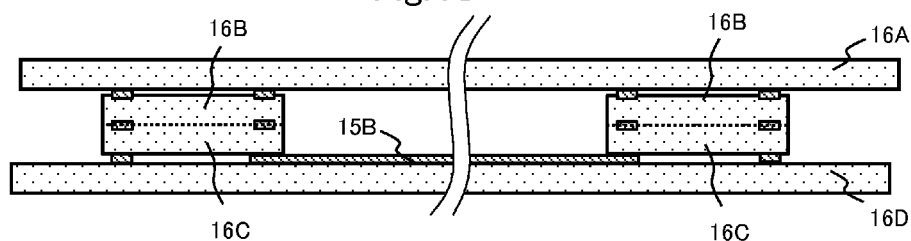

Next, the integrated resin sheets 16B and 16C are appropriately positioned and stacked between the resin sheets 16A and 16D as shown in FIG. 4C, and are heated and pressed with the heating press. Specifically, the resin sheets 16A and 16D are stacked over a region from portions where the integrated resin sheets 16B and 16C are disposed (portions which are to be the rigid portions 14A and 14B) beyond the edge portions of the integrated resin sheets 16B and 16C to a portion where the resin sheets 16B and 16C are not disposed (a portion which is to be the flexible portion 13). Then, in a state where the resin sheets 16A to 16D are stacked, the resin sheets 16A to 16D are heated and pressed to be joined to each other.

Figure 4D:
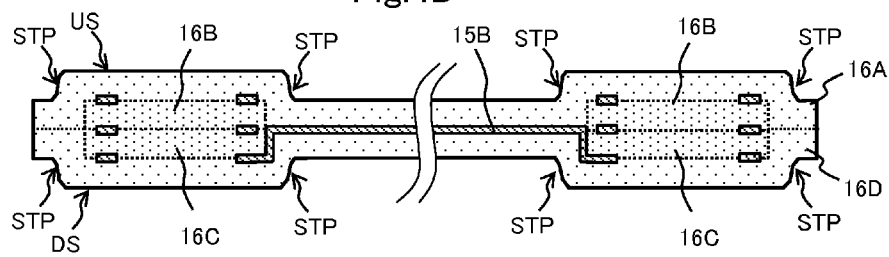

Thus, in pressing the resin sheets 16A to 16D with the heating press, the resin sheets 16A and 16D having flexibility deform along the shapes of the resin sheets 16B and 16C, so that the lower surface of the resin sheet 16A comes into the upper surface and both side surfaces of each resin sheet 16B, and the upper surface of the resin sheet 16D comes into contact with the lower surface and both side surfaces of each resin sheet 16C. Then, by heating with the heating press, the thermoplastic resin which forms the resin sheets 16A to 16D becomes softened and flows, so that gaps between the resin sheets 16A and 16D and the resin sheets 16B and 16C are almost closed. Thus, the resin sheets 16A to 16D are integrated with each other, and the structure shown in FIG. 4D is achieved.

Figure 4E:
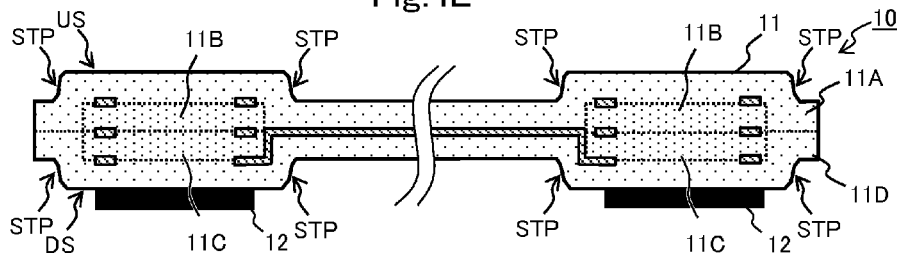

After this step, the resin sheets 16A to 16D that have been joined to each other is taken out from the heating press. After the resin sheets 16A to 16D are sufficiently cured due to fall in temperature, a plurality of resin multilayer bodies 11 are cut out from the respective board regions. Then, after the resin multilayer bodies 11 are cut out from the resin sheets 16A to 16D, the terminal portions 12 are surface-mounted on the lower principal surface LS of the resin layer 11D by using solder or the like. Thus, the structure shown in FIG. 4E is achieved.

Through each step described above, the flexible board 10 according to the first preferred embodiment may be manufactured.

Next, a flexible board 20 according to a reference example will be described.

Figure 5A:
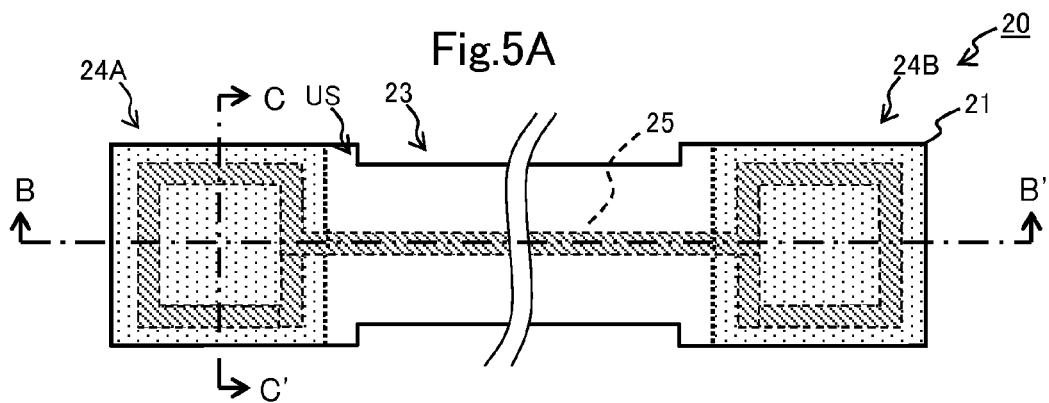
FIG. 5A is a plan view of a flexible board according to a reference example.
Figure 5B:
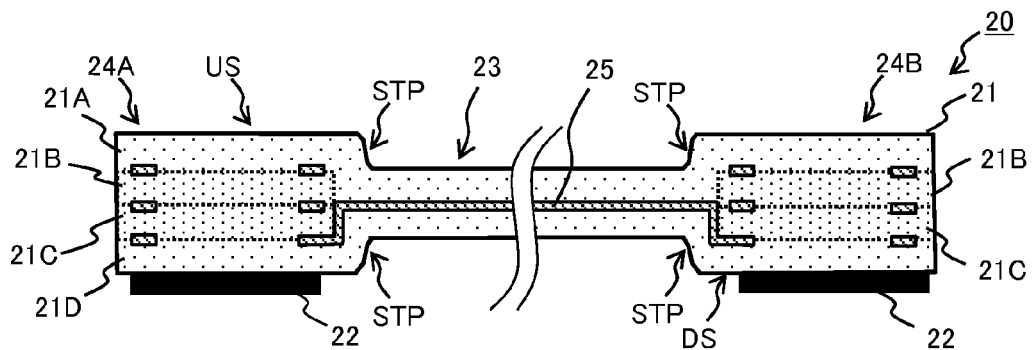
FIGS. 5B and 5C are side cross-sectional views of a flexible board according to a reference example.
Figure 5C:
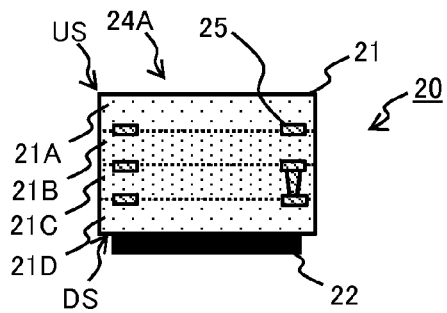

FIG. 5A is a plan view of the flexible board 20. FIG. 5B is a side cross-sectional view of the flexible board 20 at a position shown by B-B' in FIG. 5A. FIG. 5C is a side cross-sectional view of the flexible board 20 at a position shown by C-C' in FIG. 5A. The flexible board 20 is an example of the "multilayer board".

The flexible board 20 includes a resin multilayer body 21 and terminal portions 22. The resin multilayer body 21 includes rigid portions 24A and 24B and a flexible portion 23. In addition, the resin multilayer body 21 includes resin layers 21A, 21B, 21C, and 21D and a conductor pattern 25. The rigid portions 24A and 24B are an example of the "thick portion", and the flexible portion 23 is an example of the "flexible portion". In addition, the resin layer 21A is an example of the "first resin base material portion", and the resin layer 21D is an example of the "second resin base material portion". The resin layers 21B and 21C are an example of the "third resin base material portion".

In the present reference example, the dimensions, in the lengthwise direction, of the rigid portions 24A and 24B are shorter than those of the rigid portions according to the first preferred embodiment described above. Thus, of both side surface, in the lengthwise direction, of each of the rigid portions 24A and 24B, at the side surface at the side opposite to the flexible portion 23 side, all the side surfaces of the resin layers 21A to 21D are caused to overlap (be flush with each other).

In this case as well, the number of the laminated resin layers at each of the rigid portions 24A and 24B preferably is larger than the number of the laminated resin layers at the flexible portion 23, such that the rigid portions 24A and 24B are allowed to have a larger thickness and higher rigidity than the flexible portion 23. In addition, even if the number of the laminated resin layers at the rigid portions 24A and 24B is partially different, the resin layer 21A or the resin layer 21D is exposed on the entirety of each of the upper principal surface US and the lower principal surface LS of the resin multilayer body 21, the joined surfaces between the resin layers 21A to 21D are not exposed, and it is possible to prevent interlayer peeling of the resin layers 21A to 21D from progressing from the step portion STP at which the number of the laminated resin layers changes. In addition, with such a configuration as in the flexible board 20, it is possible to make the dimension, in the lengthwise direction, of the flexible board 20 shorter than that in the first preferred embodiment described above.

In the flexible board according to the present reference example, the configuration of each of the portions other than the portions described above is the same as the configuration of each portion of the flexible board according to the first preferred embodiment described above.

Next, a flexible board 30 according to a second preferred embodiment of the present invention will be described.

Figure 6A:
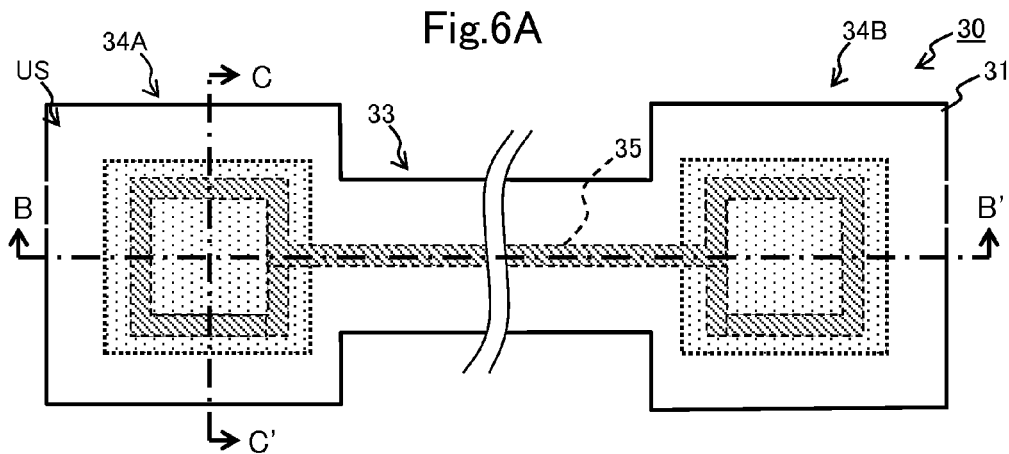
FIG. 6A is a plan view of a flexible board according to a second preferred embodiment of the present invention.
Figure 6B:
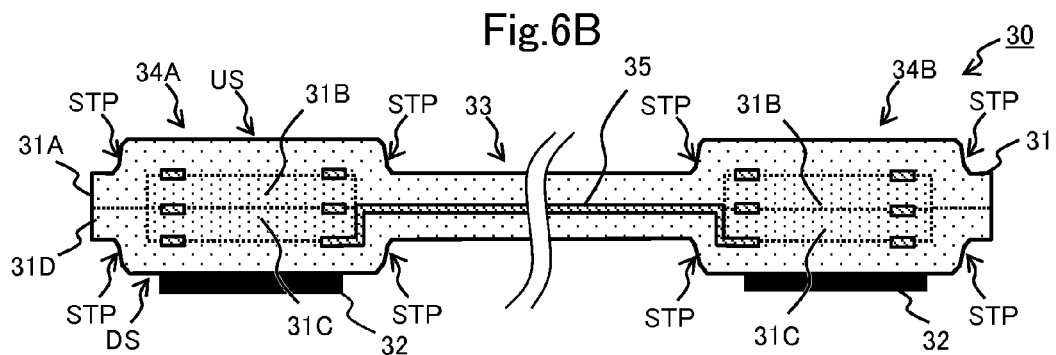
FIGS. 6B and 6C are side cross-sectional views of a flexible board according to a second preferred embodiment of the present invention.
Figure 6C:
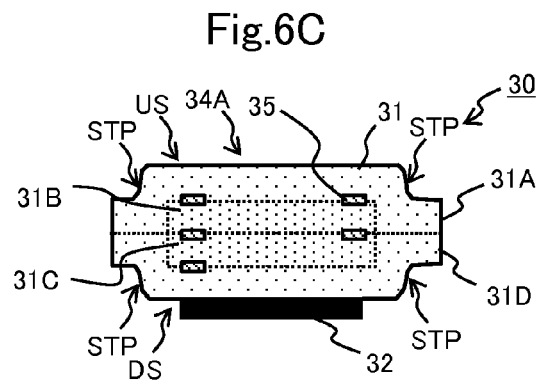

FIG. 6A is a plan view of the flexible board 30. FIG. 6B is a side cross-sectional view of the flexible board 30 at a position shown by B-B' in FIG. 6A. FIG. 6C is a side cross-sectional view of the flexible board 30 at a position shown by C-C' in FIG. 6A. The flexible board 30 is also an example of the "multilayer board".

The flexible board 30 includes a resin multilayer body 31 and terminal portions 32. The resin multilayer body 31 includes rigid portions 34A and 34B and a flexible portion 33. In addition, the resin multilayer body 31 includes resin layers 31A, 31B, 31C, and 31D and a conductor pattern 35. The rigid portions 34A and 34B are an example of the "thick portion", and the flexible portion 33 is an example of the "flexible portion". In addition, the resin layer 31A is an example of the "first resin base material portion", and the resin layer 31D is an example of the "second resin base material portion". The resin layers 31B and 31C are an example of the "third resin base material portion".

In the present preferred embodiment, the dimensions, in the widthwise direction, of the rigid portions 34A and 34B are made longer than those of the rigid portions according to the first preferred embodiment described above. Thus, both side surfaces, in the widthwise direction, of each of the rigid portions 34A and 34B are spaced apart from both side surfaces, in the widthwise direction, of each of the resin layers 31B and 31C.

Therefore, at both end portions, in the widthwise direction, of each of the rigid portions 34A and 34B, the resin layers 31B and 31C do not overlap and only the resin layers 31A and 31D overlap as seen in the lamination direction, and the number of the laminated resin layers is two. That is, the resin layers 31A and 31D cover the entirety of the edge portions of the two resin layers 31B and 31c composed of two resin base materials, as seen from the lamination direction of the resin multilayer body 31, and wrap the entirety of the resin layers 31B and 31C.

In this case as well, the number of the laminated resin layers at each of the rigid portions 34A and 34B is made larger than the number of the laminated resin layers at the flexible portion 33, such that the rigid portions 34A and 34B are allowed to have a larger thickness and higher rigidity than the flexible portion 33. In addition, even if the number of the laminated resin layers at each of the rigid portions 34A and 34B is partially different, the resin layer 31A or the resin layer 31D is exposed on the entirety of each of the upper principal surface US and the lower principal surface LS of the resin multilayer body 31, the joined surfaces between the resin layers 31A to 31D are not exposed, and it is possible to prevent interlayer peeling of the resin layers 31A to 31D from progressing from the step portion STP at which the number of the laminated resin layers changes. In addition, both side surfaces, in the widthwise direction, of each of the resin layers 31B and 31C are covered with the resin layers 31A and 31D, such that both side surfaces, in the widthwise direction, of each of the rigid portions 34A and 34B are allowed to have a structure with which interlayer peeling is unlikely to progress.

In the case with this configuration, since the resin layers 31A and 31D are not exposed on the side surfaces of any of the rigid portions 34A and 34B, a plurality of the resin layers 31A and 31D are preferably formed as individual pieces, not in a resin sheet state, during manufacture. In this case, preferably, the plurality of the individual piece resin layers 31B and 31C are bonded or fused to the resin sheet forming the resin layer 31A or the resin sheet forming the resin layer 31D to be temporarily fixed thereto, and then each resin sheet is stacked, and is heated and pressed to be integrated.

In the flexible board according to the present preferred embodiment, the configuration of each of the portions other than the portions described above is preferably the same or substantially the same as the configuration of each portion of the flexible board according to the first preferred embodiment described above.

Next, the structure of a flexible board 40 according to another preferred embodiment of the present invention will be described.

Figure 7A:
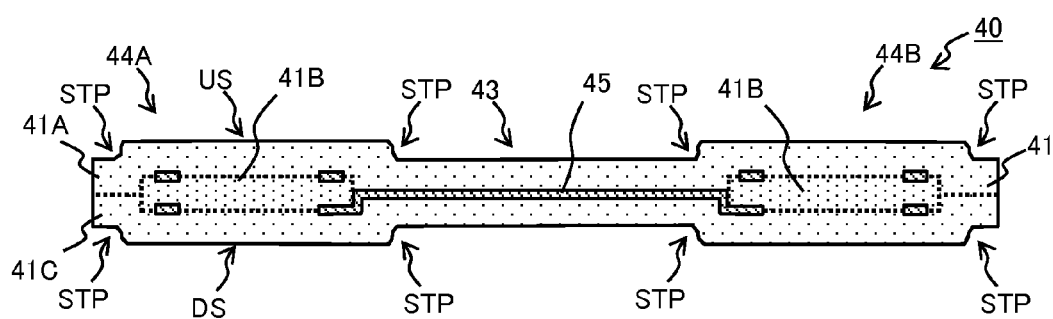
FIGS. 7A and 7B are side cross-sectional views of flexible boards according to other preferred embodiments of the present invention.

FIG. 7A is a side cross-sectional view of the flexible board 40. The flexible board 40 is also an example of the "multilayer board".

The flexible board 40 includes a resin multilayer body 41. The resin multilayer body 41 includes rigid portions 44A and 44B and a flexible portion 43. In addition, the resin multilayer body 41 includes resin layers 41A, 41B, and 41C, and a conductor pattern 45. The rigid portions 44A and 44B are an example of the "thick portion", and the flexible portion 43 is an example of the "flexible portion". In addition, the resin layer 41A is an example of the "first resin base material portion", and the resin layer 41C is an example of the "second resin base material portion". The resin layer 41B is an example of the "third resin base material portion".

In the flexible board 40, the resin layer 41B as a single layer defines the third resin base material portion. The third resin base material portion may be composed of a single layer as described above, and can be composed of at least one or more resin layers.

Figure 7B:
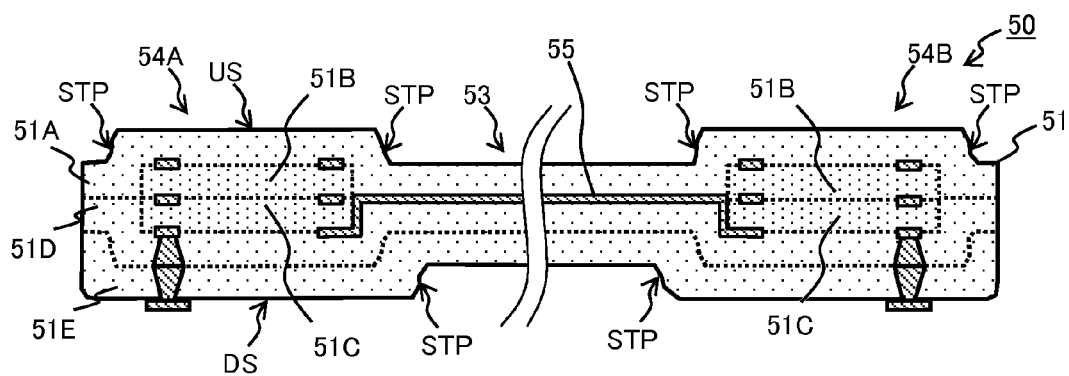

FIG. 7B is a side cross-sectional view of a flexible board 50. The flexible board 50 is also an example of the "multilayer board".

The flexible board 50 includes a resin multilayer body 51. The resin multilayer body 51 includes rigid portions 54A and 54B and a flexible portion 53. In addition, the resin multilayer body 51 includes resin layers 51A, 51B, 51C, 51D, and 51E and a conductor pattern 55. The rigid portions 54A and 54B are an example of the "thick portion", and the flexible portion 53 is an example of the "flexible portion". In addition, the resin layer 51A is an example of the "first resin base material portion", and the resin layers 51D and 51E are an example of the "second resin base material portion". The resin layers 51B and 51C are an example of the "third resin base material portion".

In the flexible board 50, the resin layers 51D and 51E as two layers form the second resin base material portion. The second resin base material portion may be composed of a plurality of layers which are two or more layers as described above, and can be composed of at least one or more resin layers. Similarly, the first resin base material portion may be composed of a plurality of layers which are two or more layers, and can be composed of at least one or more resin layers. In addition, each of the first resin base material portion and the second resin base material portion can be composed of a plurality of layers which are two or more layers.

In each of the above preferred embodiments, the case has been described in which the resin layer 11A, 21A, 31A, 41A, or 51A (first resin base material portion) preferably defines the entirety of the upper principal surface US of the resin multilayer body, and the resin layer 11D, 21D, 31D, 41C, or 51E (second resin base material portion) defines the entirety of the lower principal surface LS of the resin multilayer body, but the present invention is not limited thereto. In various preferred embodiments of the present invention, if each of the first resin base material portion and the second resin base material portion is configured to extend in a region from the thick portion beyond the step portion STP to the flexible portion, the first resin base material portion and the second resin base material portion may define only portions of the upper principal surface US and the lower principal surface LS.

In the above preferred embodiments, the rigid portions are shown as an example of the thick portion of the present invention, but the present invention is not limited thereto. In the present invention, if the thickness of the thick portion is made larger than that of the flexible portion by the third resin base material portion being provided, the thick portion may be configured to have flexibility similarly to the flexible portion.

In the above preferred embodiments, the case has been described in which the flexible portion (flexible part) is formed in an elongated cable shape, but the present invention is not limited thereto. In preferred embodiments of the present invention, the flexible portion may have a shape other than an elongated cable shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a first resin base material portion;
   a second resin base material portion; and
   a third resin base material portion; wherein
   the first, second and third resin base material portions include a same thermoplastic resin as a principal material and are laminated on each other; wherein
   the first resin base material portion defines a first principal surface of the multilayer board;

the second resin base material portion defines a second principal surface of the multilayer board;

the third resin base material portion is provided between the first resin base material portion and the second resin base material portion in a lamination direction of the multilayer board;

a step portion at which a thickness of the multilayer board changes is provided between a flexible portion which has flexibility and in which the third resin base material portion is not disposed and a thick portion in which the third resin base material portion is disposed so that the thick portion has a thickness larger than that of the flexible portion;

the first resin base material portion and the second resin base material portion extend in a region from the thick portion beyond the step portion to the flexible portion;

the first resin base material portion and the second resin base material portion cover both ends of the third resin base material portion in a first direction in which the first resin base material portion and the second resin base material portion extend in a region from the thick portion beyond the step portion to the flexible portion; and the first resin base material portion and the second resin base material portion are joined directly to one another at outermost ends of the multilayer board in the first direction.

2. The multilayer board according to claim 1, wherein the first resin base material portion and the second resin base material portion extend over an entire or substantially an entire area of the flexible portion.

3. The multilayer board according to claim 1, wherein the third resin base material portion includes a plurality of layers which include a plurality of resin base materials.

4. The multilayer board according to claim 3, wherein the first resin base material portion and the second resin base material portion cover an entirety of an edge portion of the third resin base material portion which includes the plurality of layers which are the plurality of resin base materials.

5. The multilayer board according to claim 1, wherein
the thick portion is provided at two locations; and
the flexible portion is provided between the thick portions at the two locations.

6. The multilayer board according to claim 5, wherein the first resin base material portion and the second resin base material portion extend in the first direction of the flexible portion from the thick portion at one side beyond the step portion at the one side, the flexible portion, and the step portion at the other side to the thick portion at the other side.

7. The multilayer board according to claim 1, wherein the flexible portion has a band shape extending in a lengthwise direction.

8. The multilayer board according to claim 1, wherein the rigid portion is wider than the flexible portion.

9. The multilayer board according to claim 1, wherein the rigid portion is thicker than the flexible portion in the lamination direction.

10. The multilayer board according to claim 1, wherein the first, second and third resin base material portions include one of a liquid crystal polymer resin, a polyether ether ketone resin, a polyether imider resin, a polyphenylene sulfide resin, and a polyimide resin as the principal material.

11. The multilayer board according to claim 1, further comprising a conductor pattern having a linear shape provided at the flexible portion so as to extend from the thick portion to another thick portion.

12. The multilayer board according to claim 1, wherein the first, second and third resin base material portions are fused to each other and integral with each other.

13. The multilayer board according to claim 1, further comprising interlayer connection conductors extending through the first, second and third resin base material portions.

14. The multilayer board according to claim 1, further comprising planar or substantially planar conductors extending along a surface of each of the first, second and third resin base material portions.

15. The multilayer board according to claim 1, wherein more resin layers are provided at the thick portion than at the flexible portion.

16. The multilayer board according to claim 1, wherein at least one of the first, second and third resin base material portions defines an entirety of an upper principal surface of the multilayer board.

17. The multilayer board according to claim 1, wherein at least one of the first, second and third resin base material portions defines an entirety of a lower principal surface of the multilayer board.

18. The multilayer board according to claim 1, wherein the flexible portion has an elongated cable shape.

* * * * *